United States Patent [19]

Hu et al.

[11] 4,342,098

[45] Jul. 27, 1982

[54] ASYMMETRIC SAWTOOTH CONTIGUOUS DISK PROPAGATION PATTERN

[75] Inventors: Hung L. Hu, Sunnyvale; Kochan Ju, San Jose, both of Calif.

[73] Assignee: International Business Machines Corporation, Armonk, N.Y.

[21] Appl. No.: 180,714

[22] Filed: Aug. 25, 1980

[51] Int. Cl.³ .............................................. G11C 19/08
[52] U.S. Cl. ......................................... 365/36; 365/15
[58] Field of Search ............................... 365/36, 41, 15

[56] References Cited

U.S. PATENT DOCUMENTS 3,828,329 8/1974 Fischer et al. ......................... 365/36
4,007,447 2/1977 Bobeck ................................... 365/41

OTHER PUBLICATIONS

IEEE Transactions on Magnetics–vol. Mag. 15, No. 5, Sep. 1979, pp. 1323–1325.
IBM Technical Disclosure Bulletin–vol. 23, No. 5, Oct. 1980, p. 2112.
Journal of Applied Physics—vol. 48 (12) Dec. 1977, pp. 5201–5208.

*Primary Examiner*—James W. Moffitt
*Attorney, Agent, or Firm*—Joseph E. Kieninger

[57] ABSTRACT

A propagation pattern for contiguous disk bubble devices consists of a plurality of parallel propagation tracks in which each propagation track is asymmetric. Adjacent propagation tracks are positioned so that the cusps that face each other are aligned therewith. The region between adjacent tracks forms two subregions which are mirror images of each other when the region is bisected by a longitudinal midplane.

5 Claims, 4 Drawing Figures

ASYMMETRIC SAWTOOTH CONTIGUOUS DISK PROPAGATION PATTERN

DESCRIPTION

1. Technical Field

This invention relates to contiguous disk bubble devices, and more particularly to an asymmetric sawtooth propagation pattern.

It is a primary object of this invention to provide an improved contiguous disk device.

It is still another object of this invention to provide a contiguous disk pattern having a high packing density.

It is another object of this invention to provide a contiguous disk pattern that provides a good propagation margin.

2. Background Art

Contiguous disk patterns were discussed in a paper entitled, "Crystal Symmetry Effects in Ion Implanted Propagation Patterns for Magnetic Bubbles" by Wolfe and Nelson at Florence, Italy IEEE meeting of 1978. FIGS. 1A and 1B were disclosed at that meeting. FIG. 1A describes a progapation track 10 that includes non-ion implanted regions 11 which have trigonal symmetry. In addition, the ion implanted regions 12 between the tracks also have trigonal symmetry.

The propagation tracks 13 shown in FIG. 1B include non-ion implanted regions 14A and B that are asymmetric, and the ion implanted regions 15 are also asymmetric.

Another contiguous disk propagation pattern by C. C. Shir, disclosed in the IBM Technical Disclosure Bulletin, Vol. 23, No. 5, page 2112, Oct. 1980, as shown in FIG. 1C. This propagation pattern 16 has non-ion implanted regions 17 that have trigonal symmetry, and the ion implanted regions 18 between the tracks have trigonal symmetry.

Overlay undulating contiguous disk patterns are described in the Lin, et al. article entitled, "Manipulation of 1-$\mu$m Bubbles with Coarse (<4 $\mu$m) Overlay Patterns", published in the J. APPL. PHYS., Vol. 48 (12), Dec. 1977, pages 5201-5208. The propagation tracks are symmetrical and the ion implanted regions between the tracks are symmetrical.

BRIEF DESCRIPTION OF THE DRAWINGS

In the accompanying drawings forming a material part of this disclosure.

DISCLOSURE OF THE INVENTION

For a further understanding of the invention and of the objects and advantages thereof, reference will be had to the following description and accompanying drawings common to the appendent claims in which the various novel features of the invention are more particularly set forth.

A propagation pattern for contiguous disk bubble devices consists of a plurality of parallel propagation tracks in which each propagation track is asymmetric. Adjacent propagation tracks are positioned so that the cusps that face each other are aligned therewith. The region between adjacent tracks forms two sub-regions which are mirror images of each other when the region is bisected by a longitudinal mid-plane.

BEST MODE FOR CARRYING OUT THE INVENTION

Figure 2:
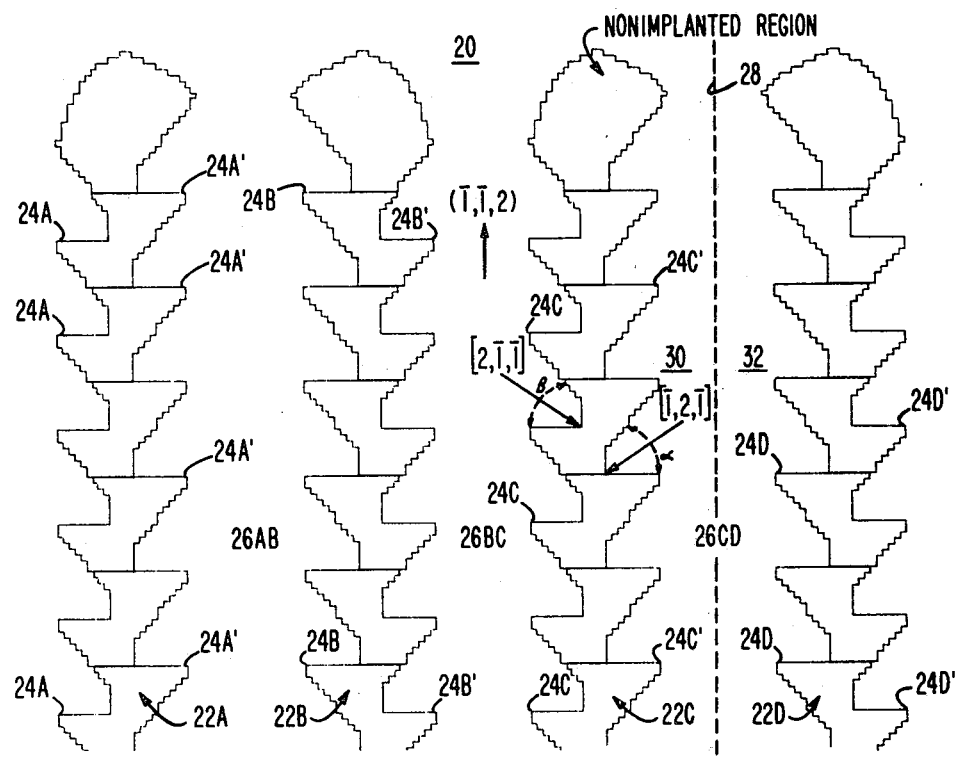
FIG. 2 is a top view of asymmetric contiguous disk propagation patterns in accordance with this invention.

In accordance with this invention, an asymmetric sawtooth contiguous propagation pattern 20, as shown in FIG. 2, includes propagation tracks 22A, B, C and D. Propagation tracks 22A-D have cusps 24A-D on one side of the track and cusps 24A'-D' on the other side of the track. The cusp 24A'-D' are shifted by half of a period relative to the cusps 24A-D on the other side of the track.

Neighboring tracks, for example 22A and 22B, 22B and 22C, and 22C and 22D have mirror symmetry with respect to each other so that the ion implanted region 26AB, 26BC and 26CD, respectively, which separate them is symmetrical. When the region between adjacent tracks, for example 26CD, is bisected by a longitudinal mid-plane line 28 into two sub-regions 30 and 32, these two sub-regions 30 and 32 are mirror images of each other. The same relationship exists between the propagation tracks 22A and 22B, and between 22B and 22C.

All propagation tracks 22A-D are parallel to one of the following three crystal directions: $(\bar{1},\bar{1},2)$, $(\bar{1},2,\bar{1})$, and $(2,\bar{1},\bar{1})$. Every cusp is oriented such that one of the three crystal axes mentioned above is substantially bisecting the cusp angle.

As shown in FIG. 2, the cusp angles $\alpha$ and $\beta$ are substantially bisected by the crystal axes $[1,2,\bar{1}]$ and $[2,1,\bar{1}]$ respectively, which are directed into the cusps.

Figure 1A:
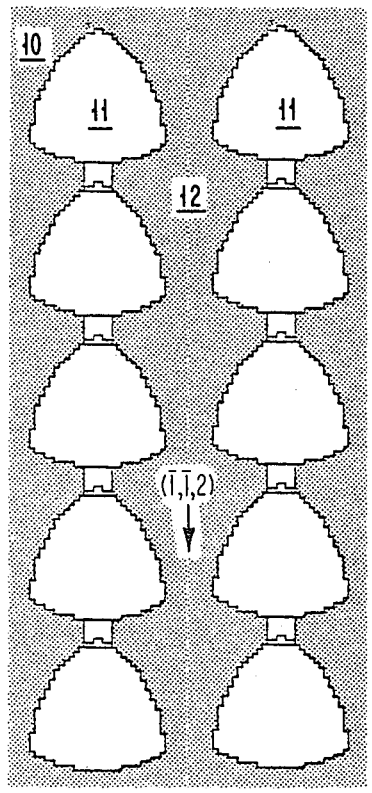
FIGS. 1A, B and C are top view of prior art contiguous disk patterns.
Figure 1B:
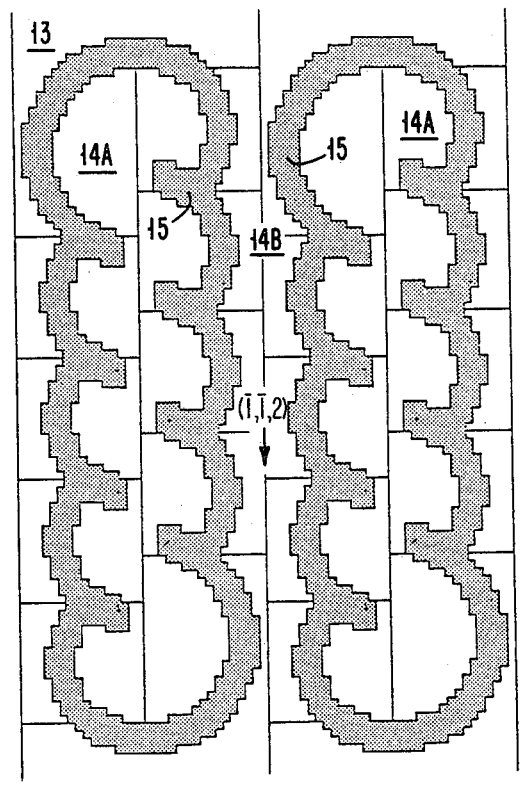
Figure 1C:
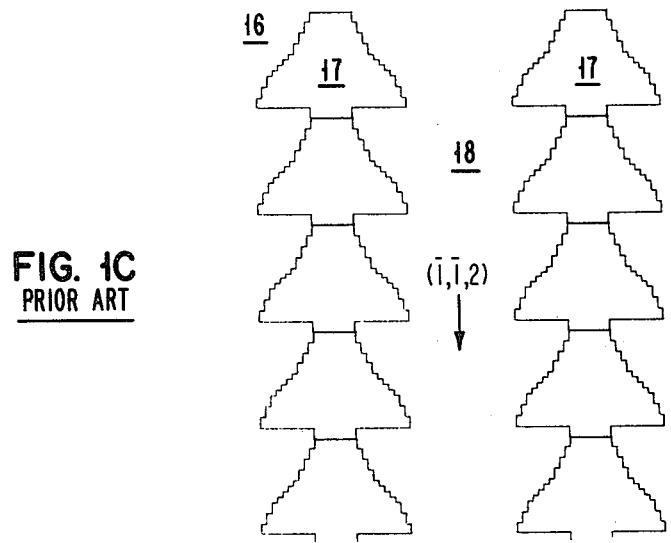

The offset of the cusp on the sides of the track allows a higher packing density for a given minimum feature or a given minimum bubble-bubble spacing. The cusp orientation as well as the symmetry in the implanted region is important in preserving the minor loop margin when the cell size is reduced. Preliminary testing on chips with 18 square micron cell size asymmetric sawtooth design shows a minor loop propagation margin of 38 Oe (11.5%) at 300 kHz rotating field frequency. The propagation margin for the 30 square micron cell size minor loops with the pattern of FIG. 1C is 46 Oe (14%). Other tests have shown that the propagation pattern described herein yields bias field margins as large as 12% (of the mid-bias field) for 16 square micron cell size minor loops have been achieved at a rotating field frequency ranging from 100 kHz to 400 kHz with a sinusoidal drive field of 55 Oe. This data shows that the packing density is increased and that good propagation margins are obtained with these patterns.

While I have illustrated and described the preferred embodiments of my invention, it is understood that I do not limit myself to the precise construction herein disclosed, and the right is reserved to all changes and modifications coming within the scope of the invention, as described in the appendent claims.

We claim:

1. A contiguous disk propagation pattern having a plurality of parallel periodic propagation tracks comprising:
   a first propagation track having cusps on first and second sides, said cusps on said second side shifted by about half of a period relative to said cusps on said first side; and
   a second propagation track having cusps on first and second sides, said cusps on said second side shifted by about half of a period relative to the cusps on said first side, said second track is shifted longitudinally about half of a period relative to said first track.

2. A contiguous disk propagation pattern having a plurality of parallel periodic propagation tracks comprising:
   a first propagation track having cusps on first and second sides, said cusps on said second side shifted by about half of a period relative to said cusps on said first side; and
   second propagation track having cusps on first and second sides, said cusps on said second side shifted by about half of a period relative to the cusps on said first side, said cusps on said first side of said second track are substantially aligned with and facing said cusps on said second side of said first track.

3. A contiguous-disk propagation pattern having a plurality of parallel periodic propagation tracks comprising:
   a first propagation track having cusps on first and second sides, said cusps on said second side shifted by about half of a period relative to said cusps on said first side; and
   a second propagation track having cusps on first and second sides, said cusps on said second side shifted by about half of a period relative to the cusps on said first side to form a first region between said first and second tracks wherein a longitudinal midplane bisects said first region into two sub-regions which are mirror images of each other.

4. A pattern as described in claim 3 wherein said first track is parallel to one of the crystal axes directions taken from the group consisting of $(\bar{1},\bar{1},2)$, $(\bar{1},2,\bar{1})$, and $(2,\bar{1},\bar{1})$.

5. A pattern as described in claim 3 wherein said cusps on said first side of said first track is oriented so that one of the crystal axes taken from the group consisting of $(\bar{1},1,2)$, $(\bar{1},2,\bar{1})$, and $(2,\bar{1},\bar{1})$ bisects the angle of said first cusp.

* * * * *